(12) United States Patent
Chang et al.

(10) Patent No.: US 11,803,161 B2
(45) Date of Patent: Oct. 31, 2023

(54) PHYSICAL SYSTEM OF STRONTIUM OPTICAL CLOCK APPLIED FOR SPACE STATION

(71) Applicant: National Time Service Center, Chinese Academy of Sciences, Shaanxi (CN)

(72) Inventors: Hong Chang, Shaanxi (CN); Wei Tan, Shaanxi (CN)

(*) Notice: Subject to any disclaimer, the term of this patent is extended or adjusted under 35 U.S.C. 154(b) by 0 days.

(21) Appl. No.: 17/900,426

(22) Filed: Aug. 31, 2022

(65) Prior Publication Data
US 2023/0185247 A1 Jun. 15, 2023

(51) Int. Cl.
*G04F 5/12* (2006.01)
*H03L 7/26* (2006.01)

(52) U.S. Cl.
CPC . *G04F 5/12* (2013.01); *H03L 7/26* (2013.01)

(58) Field of Classification Search
CPC .................................................... G04F 5/145
USPC ......................................................... 331/94.1
See application file for complete search history.

(56) References Cited

U.S. PATENT DOCUMENTS

2015/0200029 A1* 7/2015 Hughes ................. G21K 1/006
  250/251
2019/0318831 A1* 10/2019 Dunaevsky ............. F04B 37/14

* cited by examiner

*Primary Examiner* — Joseph Chang

(57) ABSTRACT

The invention discloses a physical system of strontium optical clock applied for space station, relating to the field of optical atomic clocks, comprising a special-shaped cavity and a MOT cavity. A Zeeman slower is arranged between the special-shaped cavity and the MOT cavity, and the special-shaped cavity and the MOT cavity are provided with a plurality of interfaces that communicate with their interiors; an internal heating atomic oven is arranged in the special-shaped cavity, and an anti-Helmholtz coil and a remanence compensation coil are arranged on the outer wall of the MOT cavity; the two cavities are both connected with a vacuum device for forming a vacuum, and both the special-shaped cavity and the MOT cavity are provided with opto-mechanical components. The system integrates the internal heating atomic oven in the special-shaped cavity to reduce the space occupied by the heating atomic oven.

10 Claims, 4 Drawing Sheets

PHYSICAL SYSTEM OF STRONTIUM OPTICAL CLOCK APPLIED FOR SPACE STATION

1. TECHNICAL FIELD

The invention belongs to the technical field of atomic optical clock, specifically relating to a physical system of strontium optical clock applied for space station.

2. BACKGROUND ART

In the past two decades, optical clocks have developed rapidly. The frequency stability and uncertainty of terrestrial optical clocks have reached the order of $10^{-18}$, which is two orders of magnitude higher than the current frequency standard of cesium atomic clocks. The structure of optical clocks is far more complicated than that of cesium atomic clocks, therefore optical clock systems in ground laboratories often occupy several square meters of laboratory area. For the key component of the optical clock system, that is, the optical clock physical system, its main function is to obtain ultracold atomic samples that can be used as quantum frequency references. In order to achieve high-quality ultracold atom, optical clock physical systems often have relatively large volumes and weights to facilitate efficient deceleration and capturing of atoms. Additionally, because optical clocks generally require lasers of multiple wavelengths to work together and timing management of multiple lasers, complex optical paths must be arranged around the optical clock physical system, which also increases the volume and weight of the optical clock physical system.

In fact, many research groups in China and abroad have carried out the development of miniaturized portable optical clocks, aiming to develop a set of optical clocks that are small in volume, light in weight and highly integrated. In 2014, the experimental group in Italy realized a transportable $^{88}$Sr optical clock with a frequency uncertainty of $7.0\times10^{-15}$. In 2017, the German PTB (Physikalisch-Technische Bundesanstalt) realized a vehicle-mounted $^{87}$Sr optical clock with a frequency uncertainty of $7.4\times10^{-17}$, which is the highest precision reported in the world for a transportable optical clock. In 2020, the research group of H. Katori in Japan developed two transportable strontium atomic optical lattice clocks, whose stability and uncertainty reached the order of $10^{-18}$. They successfully verified the general relativity of Einstein using these two clocks. The Wuhan Institute of Physics and Mathematics, Chinese Academy of Sciences has realized a transportable calcium ion optical clock with a system uncertainty of $7.8\times10^{-17}$. The National Timing Service Center, Chinese Academy of Sciences carried out the development of the transportable strontium atomic optical clock, which has realized the miniaturization of the physical system and the detection of clock transition spectrum.

Because the special microgravity environment in space is very favorable to improve the performance indicators of optical clocks, the space cold atomic optical clocks have great potential and broad application prospects. On the basis of portable optical clocks, it is inevitable to continue to miniaturize optical clocks. So far, many research groups in China and abroad have actively carried out the development of space optical clocks. The first was the ESA space atomic clock project, which is still in the testing stage of the terrestrial prototype. In 2018, the cooperative units of the EU Space Optical Clock Project, the University of Düsseldorf in Germany, PTB, and the University of Birmingham in the United Kingdom jointly reported an $^{88}$Sr optical lattice clock for space applications. The volume of its physical system is about 99 cm*60 cm*45 cm, and the uncertainty reaches $2.0\times10^{-17}$. The United States has also carried out related research and development work, but there has been no substantial report on the space optical clock yet.

The optical clock physical system consists of two parts: physical vacuum cavity and periphery optical path. The physical vacuum cavity is a set of metal chambers with ultra-high vacuum on which flanges with glass windows are installed to realize the manipulation of atoms by laser and the detection of atomic signals. To realize the deceleration and capture of atoms based on the magneto-optical effect of atoms, it is also necessary to install magnetic field coils wound by copper wires on the physical vacuum cavity. Atomic heating oven also needs to be installed on the physical vacuum cavity to generate gas atoms. The peripheral optical path is composed of a variety of optomechanical components and optical components. The main purpose is to construct an optical path for capturing atoms and detecting optical clock signals. Currently, in order to achieve the most perfect operating state, the optical clock physics system under research generally uses a variety of bulky devices. These mainly include bulky slower coils, anti-Helmholtz coils, remanence compensation coils, large-window MOT cavity, external atomic heating oven, atomic beam collimation window with large cross-sectional area, atomic frequency reference system and high degree of freedom but complex optical path device. The bulky coil generates huge weight, and because the coil heat dissipation problem must be cooled by water cooling, the complexity of the system is greatly increased and the long-term operation of the system gains risk. Although a large-window MOT cavity can easily capture more atoms and reduce atomic collisions under special conditions, this will lead to an increase in the volume and weight of the MOT cavity. Maintaining the vacuum in such a large volume cavity also requires a faster evacuating speed and a larger ion pump. External atomic heating oven can effectively reduce the blackbody radiation in the cavity, but it also greatly increases the volume and length of the system. In order to increase the captured atoms in the MOT cavity, a collimation window with a large area is generally used, which is also one of the reasons for the large volume of the physical vacuum system. On the other hand, in order to stabilize the frequency detuning of the laser, the center frequency of the 461 nm laser is generally locked to a set of external strontium atomic beams. This makes it necessary to install a miniaturized vacuum system and oven outside of the physical system. In the physical system of strontium atomic optical clock, 16 lasers are to be coupled into the physical system, and these lasers are further divided into six wavelengths. The use of conventional commercial optomechanical devices and optical components requires the construction of extremely complex optical paths, and a large number of optical components and frames also increase the instability of the system.

To sum up, the conventional optical clock physical system has the disadvantages of complex structure, large volume and heavy weight. Therefore, the application proposes a physical system of strontium optical clock applied for space station.

3. SUMMARY OF THE INVENTION

To overcome the above defects of the prior art, the invention provides a physical system of strontium optical clock applied for space station.

In order to realize the above purpose, the invention provides the following technical solutions:

a physical system of strontium optical clock applied for space station, comprises:

a special-shaped cavity, in which an internal heating atomic oven for heating a strontium sample to generate a strontium atomic gas is arranged;

a MOT cavity, which is provided with an anti-Helmholtz coil for capturing strontium atoms and a remanence compensation coil for eliminating stray magnetic fields on its outer wall;

a Zeeman slower, which is arranged between the special-shaped cavity and the MOT cavity; the Zeeman slower comprises a hollow pipe whose ends are in sealed communication with the special-shaped cavity and the MOT cavity respectively, and a plurality of sets of slower coils are wound on the outer wall of the hollow pipe;

the internal heating atomic oven comprises a ceramic strontium atomic cavity arranged in the special-shaped cavity; a thermocouple fixing sleeve for fixing the strontium sample is arranged in the ceramic strontium atomic cavity, a heating wire is arranged on the outer wall of the ceramic strontium atomic cavity, and the top of the ceramic strontium atomic cavity is provided with a collimator for sending the strontium atomic gas into the MOT cavity through the hollow pipe in a straight line transmission manner;

the special-shaped cavity and the MOT cavity are provided with a plurality of interfaces that communicate with their respective interiors, and both are connected with a vacuum device for forming a vacuum through one of the interfaces; observation windows are in sealed communication with the remaining interfaces, and optomechanical components for atomic capture and optical signal detection are installed in alignment with the observation windows.

Preferably, the length of the hollow pipe is 18 cm, the outer diameter is 14 mm, and the inner diameter is 6 mm; 5 coil baffles with circular arc structure are sleeved on the outer wall of the hollow pipe, and every set of slower coil is arranged between two adjacent coil baffles.

Preferably, the multiple sets of the slower coils from near to far from the MOT cavity are respectively a first slower coil, a second slower coil, a third slower coil, and a fourth slower coil; the first slower coil and the fourth slower coil are 15-turn 23-layer of winding structure, and the second slower coil and the third slower coil are 15-turn 10-layer winding structure; the slower coils are made of copper enameled wire with a diameter of 1.5 mm.

Preferably, the outer part of the ceramic strontium atomic cavity is sheathed with a plurality of heat shielding cylinders whose diameters increase in sequence, and a top plate is provided at the ends of the plurality of the heat shielding cylinders; the collimator includes a fixing seat penetrating the top plate, and a collimator core is provided in the middle of the fixing seat; the end face of the collimator core is provided with a plurality of evenly spaced ventilation holes, and the length orientation of each ventilation hole is in the same direction as the horizontal direction; a PT100 thermocouple resistor for measuring the temperature in the oven is installed at the bottom of the ceramic strontium atomic cavity.

Preferably, the connecting end of the special-shaped cavity and the hollow pipe is provided with a plurality of observation windows, and the observation windows are respectively located on the upper surface, the lower surface, the front surface and the back surface of the special-shaped cavity.

Preferably, the MOT cavity is a hollow columnar structure, the MOT cavity is provided with 12 interfaces communicating with its interior in a circumferential direction, and two interfaces communicating with its interior are respectively provided on the upper surface and the lower surface; one of the interfaces in the upward direction is hermetically connected with the hollow pipe, one interface is arranged with a vacuum device installation cavity, and the other interfaces are all sealed with observation windows.

Preferably, the anti-Helmholtz coil is a pair of hollow coils respectively arranged on the upper and lower parts of the MOT cavity; the diameter of the two anti-Helmholtz coils is 33 mm, the distance between the two anti-Helmholtz coil centers is 33 mm, and the two anti-Helmholtz coils are both 16-turn 20-layer winding structures; the remanence compensation coil is six rectangular coils, each rectangular coil is a 5-turn 5-layer winding structure; the 6 rectangular coils form a cubic hollow coil set surrounding the upper and lower parts of the MOT cavity, and the anti-Helmholtz coil is located inside the cubic hollow coil set; the anti-Helmholtz coil and the remanence compensation coil are both wound by copper enameled wires with a diameter of 1 mm.

Preferably, the vacuum device includes a connecting flange, and the special-shaped cavity and the MOT cavity communicate with the vacuum device through the connecting flange; a ceramic rod is fixedly arranged in the connecting flange, and a plurality of getter rings are sleeved on the ceramic rod along the circumferential direction and are evenly spaced; an annular titanium sheet is arranged between two adjacent pieces of the getter rings, a mounting cylinder is arranged outside the plurality of getter rings, and a plurality of notches are hollowed out on the outer wall of the mounting cylinder; one end of the connecting flange is provided with a gas collection chamber communicating with it, and a sealing joint is provided on the gas collection chamber; a heating electrode is penetrating sealed on the outer wall of the connecting flange.

Preferably, the free end of the connecting flange is in sealed connection to the interface on the special-shaped cavity through a titanium pump nozzle, and the vacuum device is hermetically connected to the interface on the MOT cavity through the vacuum device installation cavity.

Preferably, the optomechanical component comprises a mirror sleeve mounted on the observation window. The mirror sleeve is provided with a mirror with an included angle of 45° with the horizontal plane, and the top of the mirror is provided with a laser beam expander for inputting laser.

The physical system of strontium optical clock applied for space station provided by the invention has the following advantages:

(1) Compared with the conventional physical system of strontium optical clock, through rational miniaturization of the physical vacuum cavity, the invention obtains the smallest optical clock physical vacuum cavity design under the condition that only a small amount of atoms and optical clock indicators are lost. The system is small in volume, light in weight, low in energy consumption, simple and compact in structure. The volume is 60 cm*42 cm*28 cm, which is the smallest optical clock physical system reported in China and abroad that can operate. The volume and weight of the magnetic field coils are greatly reduced due to the use of smaller sized cavities.

(2) In the invention, owing to the use of the MOT tube with an inner diameter of 11 mm and the observation window with a diameter of 16 mm, a smaller laser spot can be applied, and a miniaturized optical path design can also be adopted. From the miniaturization of hollow pipes, observation windows, laser spots, and optical components, the purpose of system miniaturization, light weight and low power consumption can be achieved. Since the internal heating atomic oven is arranged in the special-shaped cavity, the thermoelectric efficiency is greatly improved compared with that of the external heating oven. So far, the power consumption of the inner heating oven is only 14 W, and it generates little heat when operating, and the maximum surface temperature is only 40° C.

(3) The highly integrated optical path design not only improves the stability of the system, but also makes it easy and fast to disassemble and install the optical path part of the physical system, which greatly simplifies the maintenance time and difficulty of the optical path part.

(4) Integrated strontium atomic frequency reference device: integrate an external strontium atomic reference oven into the physical system to directly lock the 461 nm laser frequency inside the physical system.

(5) Highly integrated optical path device: a miniaturized and highly integrated peripheral auxiliary optical path device, which can fully realize the closed-loop requirements of optical clocks based on unilateral polarization spectrum.

4. BRIEF DESCRIPTION OF ACCOMPANY DRAWINGS

In order to explain the embodiments of the invention and the design solutions more clearly, the drawings required for the embodiments are briefly introduced as follows. The drawings in the following description are only part of the embodiments of the invention. For those skilled in the art, other drawings can also be obtained from these drawings without creative work.

Figure 1:
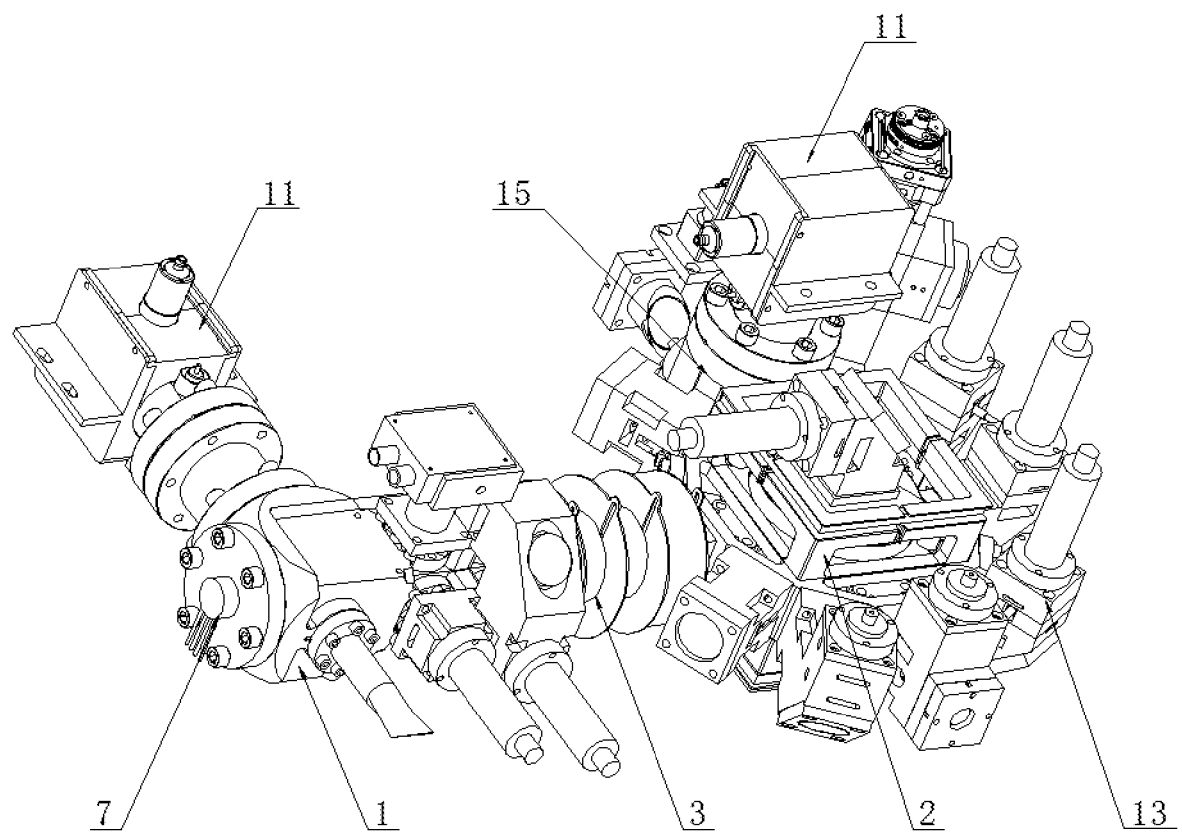
FIG. 1 is a schematic diagram of a physical system of strontium optical clock applied for space station according to embodiment 1 of the invention.
Figure 2:
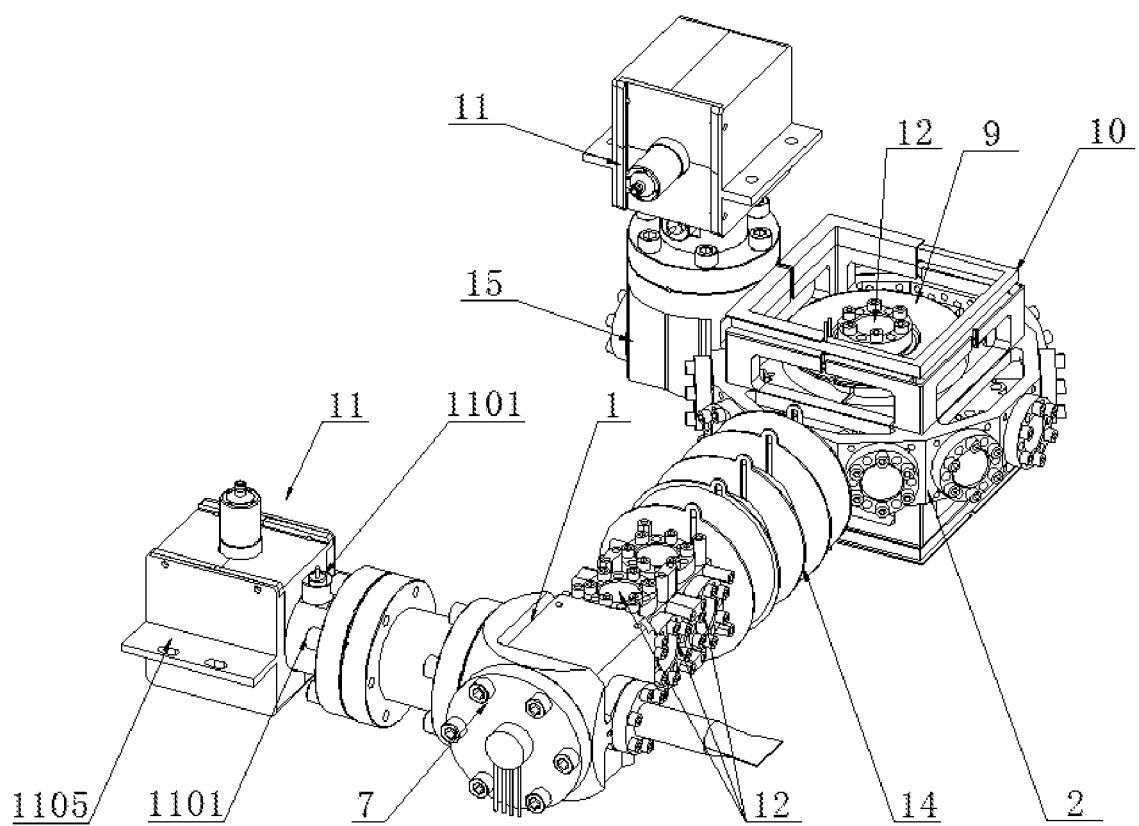
FIG. 2 is a schematic diagram of the physical system of strontium optical clock without the optomechanical component.
Figure 3:
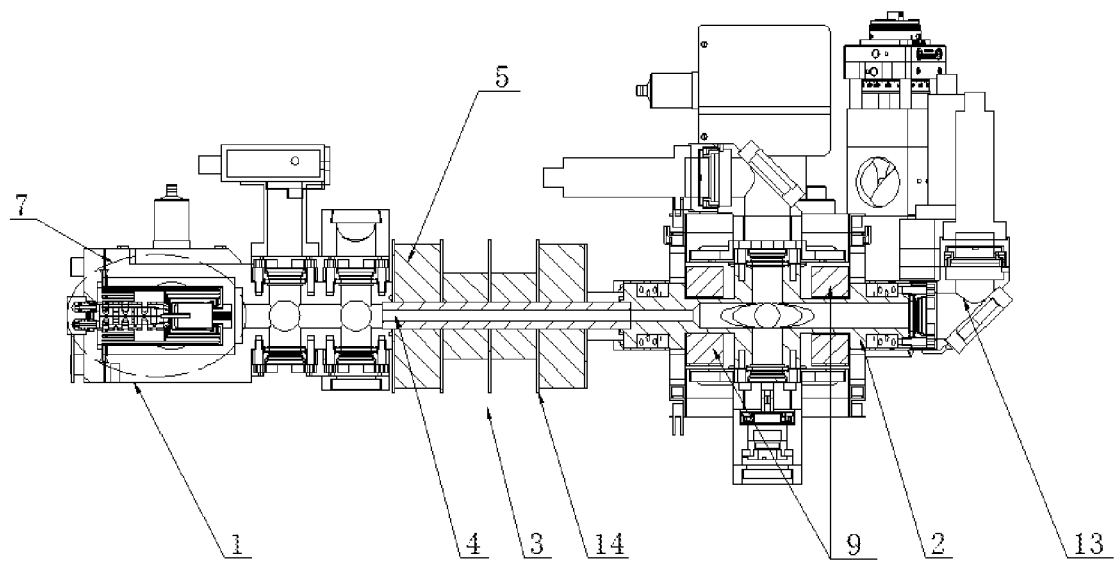
FIG. 3 is a schematic diagram of the internal structure of the physical system of strontium optical clock.

Reference numerals on the drawings:

1. special-shaped cavity; 2. MOT cavity; 3. Zeeman slower; 4. hollow pipe; 5. slower coil; 601, first slower coil; 602, second slower coil; 603, third slower coil; 604, fourth slower coil; 7. internal heating atomic oven; 701, ceramic strontium atomic cavity; 702, thermocouple fixing sleeve; 703, heating wire; 704, heat shielding cylinder; 705, top plate; 8, collimator; 801, fixed seat; 802, collimator core; 9, anti-Helmholtz coil; 10, remanence compensation coil; 11, vacuum device; 1101, connection flange; 1102, ceramic rod; 1103, getter ring; 1104, annular titanium sheet; 1105, gas collection chamber; 1106, sealing joint; 1107, heating electrode; 12, observation window; 13, optomechanical component; 1301, mirror sleeve; 1302, mirror; 1303, laser beam expander; 14, coil baffle; 15, vacuum device installation cavity.

5. SPECIFIC EMBODIMENT OF THE INVENTION

In order to enable those skilled in the art to better understand and implement the technical solutions of the invention, the invention will be described in detail below with reference to the accompanying drawings and specific embodiments. The following embodiments are only used to illustrate the technical solutions of the invention more clearly, rather than limiting the protection scope of the invention.

In the description of the invention, it should be understood that the orientation or positional relationship indicated by the terms such as "center", "longitudinal", "lateral", "length", "width", "thickness", "upper", "lower", "front", "Rear", "Left", "Right", "Vertical", "Horizontal", "Top", "Bottom", "Inner", "Outer", "Axial", "Radial", "Circumferential" is based on the orientation or positional relationship shown in the accompanying drawings, which is only for the convenience of describing the technical solutions of the invention and simplifying the description, rather than indicating or implying that the referred device or element must have a particular orientation, be constructed and operate in a particular orientation, and therefore not to be construed as limiting the invention.

Furthermore, the terms "first," "second," etc. are used for descriptive purposes only and should not be construed to indicate or imply relative importance. In the description of the invention, it should be noted that, unless otherwise expressly specified or limited, the terms "connect" and "communicate" should be understood in a broad sense. For example, it may be a fixed connection, a detachable connection, or an integrated connection; a mechanical connection or an electrical connection; a direct connection or an indirect connection through an intermediate medium. For those of ordinary skill in the art, the specific meanings of the above terms in the invention can be understood according to specific situations. In the description of the invention, unless otherwise specified, the meaning of "plurality" is two or more, which will not be described in detail here.

Embodiment 1

Figure 5:
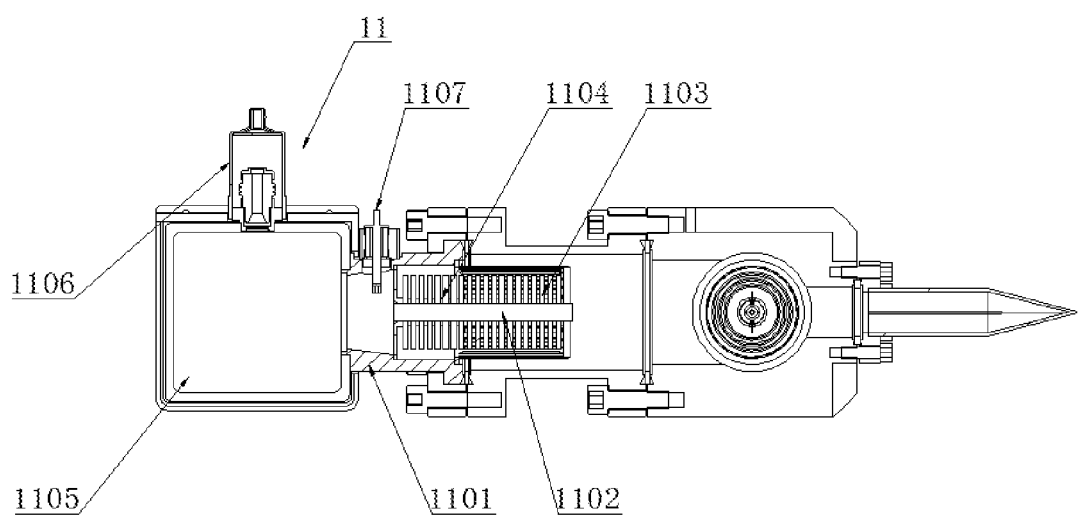
FIG. 5 is a schematic diagram of the internal structure of the vacuum device connecting the special-shaped cavity.
Figure 6:
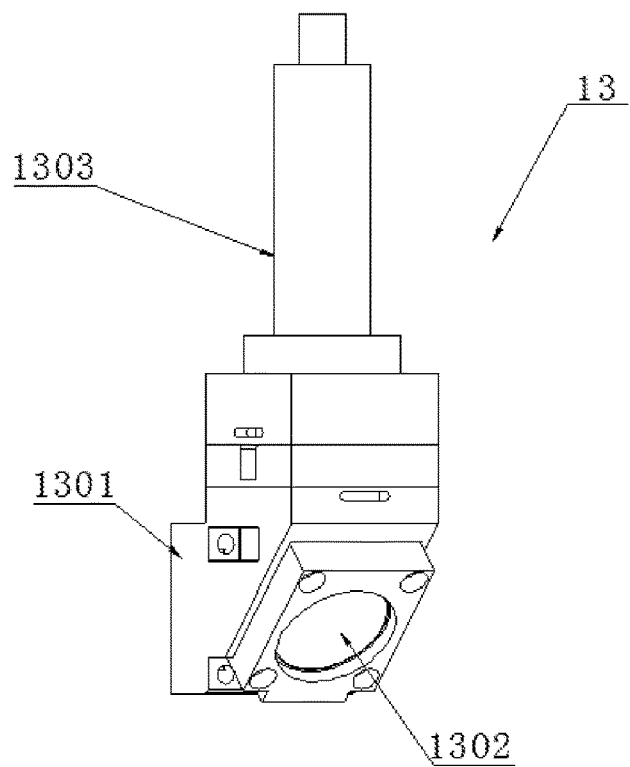
FIG. 6 is a schematic diagram of the optomechanical component.
Figure 7:
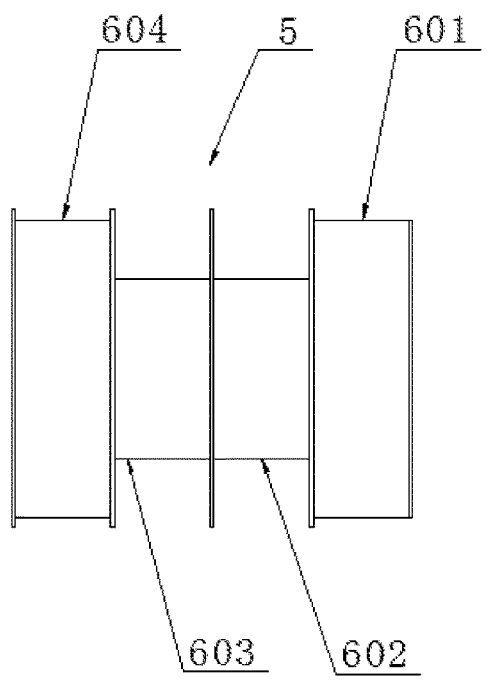
FIG. 7 is a schematic diagram of the slower coil.

The invention provides a physical system of strontium atomic optical clock applied for space station, as shown in FIGS. 1 to 7, comprising a special-shaped cavity 1 and a MOT cavity 2. The function of the special-shaped cavity 1 is to install the inner heating atomic oven 7 and the vacuum compound pump 11, realizing the 461 nm laser frequency locking, achieving the laser collimation and vacuum preparation of the atomic beam. A Zeeman slower 3 is arranged between the special-shaped cavity 1 and the MOT cavity 2. The Zeeman slower 3 includes a hollow pipe 4 sealed at both ends with the special-shaped cavity 1 and the MOT cavity 2, and the outer wall of the hollow pipe 4 is wound with slower coils 5. The special-shaped cavity 1 and the MOT cavity 2 in this embodiment are vacuum cavities, and the area where atoms are manipulated requires ultra-high vacuum inside. As a specific setting of the Zeeman slower 3, the length of the hollow pipe 4 is 18 cm, the outer diameter is 14 mm, and the inner diameter is 6 mm. The outer wall of the hollow pipe 4 is sleeved with five coil baffles 14 in a circular arc structure, and the coil baffles 14 are non-magnetic stainless steel baffles. As shown in FIG. 7, there are four sets of slower coils 5, which are respectively arranged between two adjacent coil baffles 14 on the hollow pipe 4. From near to far from the MOT cavity 2 are respectively the first slower coil 601, the second slower coil 602, the third slower coil 603, and the fourth slower coil 604, wherein the first slower coil 601 and the fourth slower coil 604 are 15-turn 23-layer of winding structure, and the second slower coil 602 and the third slower coil 603 are 15-turn 10-layer winding structure. The slower coils 5 are made of copper enameled wire with a diameter of 1.5 mm. Powering the coils with a constant current source produces a magnetic field sufficient to slow down the atoms, with a current of 2.3 A maximum.

The conventional physical system of optical clock often needs to design a slower with more than 8 sets of coils in order to reduce the most probable velocity of the atoms ejected from the atomic oven to an ideal value; due to the type selection of the hollow pipe 4, the invention can reduce the velocity of a sufficient amount of atoms to an ideal value with only 4 sets of slower coils; when producing the slower coil, first weld 5 pieces of coil baffles 14 to the hollow pipe 4, and then wind and fix the coils with adhesive.

Figure 4:
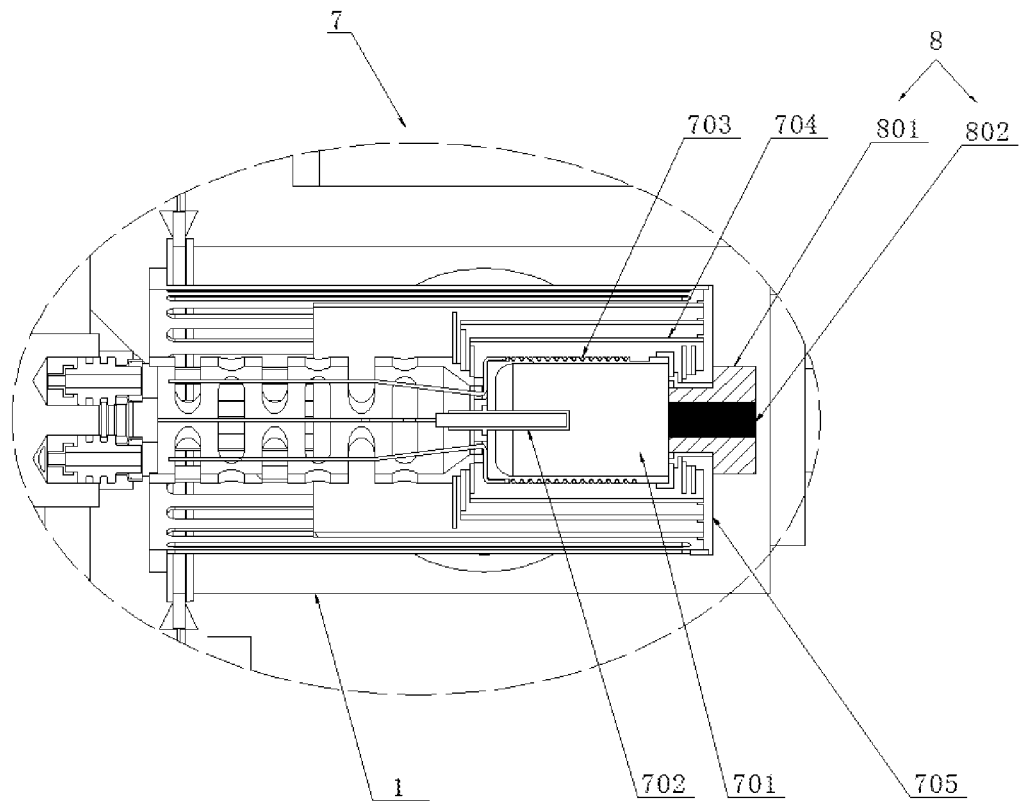
FIG. 4 is a schematic diagram of the internal structure of the internal heating atomic oven.

The special-shaped cavity 1 and the MOT cavity 2 are both provided with a plurality of interfaces communicating with their interiors; the special-shaped cavity is provided with an internal heating atomic oven 7 for heating the strontium sample to generate strontium atomic gas, and the internal heating atomic oven 7 is sealed with the special-shaped cavity 1 through an interface connection. As shown in FIG. 4, the internal heating atomic oven 7 comprises a ceramic strontium atomic cavity 701 arranged in the special-shaped cavity 1. A thermocouple fixing sleeve 702 for fixing the strontium sample is arranged in the ceramic strontium atomic cavity 701, the outer wall of the ceramic strontium atomic cavity 701 is provided with a heating wire 703 that is electrically connected to an external power source, and the top of the ceramic strontium atomic cavity 701 is provided with a collimator 8 for sending the strontium atomic gas into the MOT cavity 2 through the hollow pipe 4 in a straight line transmission manner.

Specifically, the outer part of the ceramic strontium atomic cavity 701 is sheathed with a plurality of heat shielding cylinders 704 whose diameters increase in sequence, and a top plate 705 is provided at the ends of the plurality of the heat shielding cylinders 704; the collimator 8 includes a fixing seat 801 penetrating the top plate 705, and a collimator core 802 is provided in the middle of the fixing seat 801; the end face of the collimator core 802 is provided with a plurality of evenly spaced ventilation holes, and the length orientation of each ventilation hole is in the same direction as the horizontal direction.

The internal heating atomic oven 7 is integrated in the special-shaped cavity 1 to reduce the space occupied by the heating atomic oven. The internal heating atomic oven 7 is an integrated design product, which is electrically connected to the external power supply through four pin wires to realize the heating and temperature measurement of the atomic oven. The temperature in the oven can be measured by installing a PT100 thermocouple resistance at the bottom of the ceramic strontium atomic cavity 701. The metal strontium sample contained in the ceramic strontium atomic cavity 701 is heated by the heating wire 703 to generate strontium atomic gas, and then the strontium gas is sprayed into the physical vacuum cavity through the collimator core 802.

The arrangement of multiple heat shielding cylinders 704 with successively increasing diameters allows for the most efficient heat transfer, thereby reducing power consumption. Additionally, because the inside of the special-shaped cavity is a vacuum environment, the heat dissipation of the internal heating atomic oven 7 is greatly reduced compared with the external heating method, so the heating efficiency and thermal insulation effect have been significantly improved, which will also reduce the power consumption of the entire system.

An anti-Helmholtz coil 9 for capturing strontium atoms and a remanence compensation coil 10 for eliminating stray magnetic fields are arranged on the outer wall of the MOT cavity 2.

The anti-Helmholtz coil 9 is a pair of hollow coils respectively arranged on the upper and lower parts of the MOT cavity 2; the diameter of the two anti-Helmholtz coils 9 is 33 mm, the distance between the two anti-Helmholtz coil 9 centers is 33 mm, and the two anti-Helmholtz coils 9 are both 16-turn 20-layer winding structures; after the anti-Helmholtz coil 9 is wound on the external tooling, it is installed on the MOT cavity 2 through the pressure plate and silicone rubber to ensure the best effect of the anti-Helmholtz coil 9; the anti-Helmholtz coil 9 and the remanence compensation coil 10 are both wound by copper enameled wires with a diameter of 1 mm.

The remanence compensation coil 10 is composed of six rectangular coils, and each rectangular coil is a 5-turn 5-layer winding structure. Each rectangular coil is wound in 5 turns and 5 layers using 1 mm diameter copper enameled wire. The six rectangular coils form a cubic hollow coil set surrounding the upper and lower parts of the MOT cavity, the upper and lower rectangular coils are welded and fixed to the MOT cavity 2, and the anti-Helmholtz coil is located inside the cubic hollow coil set. In order to improve the mechanical stability of the MOT cavity, the remanence compensation coil 10 is integrated with the MOT cavity 2 by means of integral processing, so as to reduce the occupied volume of the entire system.

Both the special-shaped cavity 1 and the MOT cavity 2 are connected with a vacuum device 11 for forming a vacuum through an interface. FIG. 5 is a schematic diagram of the internal structure of the connection between the vacuum device 11 and the special-shaped cavity 1. The vacuum device 11 comprises a connecting flange 1101, and the special-shaped cavity 1 and the MOT cavity 2 communicate with the vacuum device 11 through the connecting flange 1101; a ceramic rod 1102 is fixedly arranged in the connecting flange 1101, and a plurality of getter rings 1103 are sleeved on the ceramic rod 1102 along the circumferential direction and are evenly spaced; an annular titanium sheet 1104 is arranged between two adjacent pieces of the getter rings 1103, a mounting cylinder is arranged outside the plurality of getter rings 1103, and a plurality of notches are hollowed out on the outer wall of the mounting cylinder; one end of the connecting flange 1101 is provided with a gas collection chamber 1105 communicating with it, and a sealing joint 1106 is provided on the gas collection chamber 1105; a heating electrode 1107 is penetrating sealed on the outer wall of the connecting flange 1101. The setting of the getter ring 1103 meets the requirements for transportation, storage and installation in space applications. The evacuating speed of the vacuum device 11 is 100 L/s to meet the ultra-high vacuum maintenance requirements of the space optical clock physical system.

When the physical system is in transportation and storage, and the whole system is not powered, the gas released from the inside of the vacuum cavity can be absorbed by the getter ring 1103, thereby maintaining a high vacuum state in the cavity; when producing a vacuum, the vacuum device 11 is connected to the special-shaped cavity 1 to evacuate the physical vacuum cavity. After evacuating, high-strength hydraulic clamps are used to clamp the copper tube to keep the vacuum.

Specifically, for the connection between the vacuum device 11 and the special-shaped cavity 1, the free end of the connecting flange is in sealed connection to the interface on the special-shaped cavity through a titanium pump nozzle, and a copper pipe flange is communicated with the interface opposite to the connecting flange 1101 on the special-shaped cavity 1. For the connection between the vacuum device 11 and the MOT cavity 2, the vacuum device is hermetically connected to the interface on the MOT cavity through the vacuum device installation cavity.

The special-shaped cavity 1 and the MOT cavity 2 are provided with a plurality of observation windows 12 with transparent glass, and each observation window 12 is sealed with a corresponding interface. Specifically, a plurality of observation windows 12 are arranged at the connecting end of the special-shaped cavity 1 and the hollow pipe 4. The plurality of observation windows 12 are respectively located on the upper surface, the lower surface, the front surface and the back surface of the special-shaped cavity 1, so as to facilitate the collimation of the strontium atomic gas at the connection end of the special-shaped cavity 1 and the detection process of the strontium atomic fluorescence. A boss is designed near the observation windows 12 for installing the peripheral optical path.

The MOT cavity 2 has a hollow columnar structure. The MOT cavity 2 is provided with 12 interfaces communicating with its interior in a circumferential direction, and the upper surface and the lower surface of the MOT cavity 2 are respectively provided with an interface. One of the interfaces in the upward direction is hermetically connected with the hollow pipe 4, one interface is arranged with a vacuum device installation cavity 15, and the other interfaces are all sealed with observation windows 12. The special-shaped cavity 1 and the MOT cavity 2 are provided with a plurality of optomechanical components 13 installed in alignment with the observation windows 12 for capturing atoms and detecting optical clock signals. The arrangement of multiple interfaces and observation windows 12 on the MOT cavity 2 facilitates the integrated arrangement of the optomechanical components 13. The formed optical path has simple structure, reasonable and compact distribution, which realizes miniaturization of the entire strontium atomic optical clock physical system.

In this embodiment, there are 14 sets of optomechanical components 13 in total. As shown in FIG. 6, the optomechanical component 13 comprises a mirror sleeve 1301 mounted on the observation window 12, the mirror sleeve 1301 is provided with a mirror 1302 with an included angle of 45° with the horizontal plane, and the top of the mirror 1302 is provided with a laser beam expander (1303) for inputting laser. Compared with the optical path built by the conventional discrete mirror frame, the optical path structure of the integrated design is more compact and more convenient for system maintenance.

Embodiment 2

As shown in FIGS. 1 to 7, this embodiment makes further restrictions on the basis of Embodiment 1, and this embodiment mainly makes further restrictions on the specific structures of the special-shaped cavity 1 and the MOT cavity 2: the special-shaped cavity 1 is provided with 2 CF35 flange interfaces, 9 CF16 flange interfaces and 1 output with a diameter of 12 mm; the angle between the center lines of the two CF35 flange interfaces and one end of the special-shaped cavity 1 is 90 degrees, and one of the CF35 flange interfaces is used to mount the vacuum device 11; the axis of the CF35 flange interface where the vacuum device 11 is installed is perpendicular to the atomic beam ejection direction, and the CF35 flange interface side is provided with a CF16 flange interface for installing a vacuum valve; the other CF35 flange interface is used to install the internal heating atomic oven 7, and the axis of the CF35 flange interface installed with the internal heating atomic oven 7 is parallel to the atomic beam spraying direction. In this embodiment, the side of the special-shaped cavity 1 close to the Zeeman slower 3 is provided with 8 CF16 flange windows in double rows that communicate with each other, and the glass window flanges are installed. The center lines of the remaining 8 CF16 flange interfaces are perpendicular to the center line of the output. The 8 CF16 flange interfaces are equally divided into two groups, and the included angle of the central axis of each group of CF16 flange interfaces is 90 degrees; one set of CF16 flange interfaces near the internal heating atomic oven 7 are used to install the fluorescence detection optical path to achieve laser frequency locking, and one set of CF16 flange interfaces near the output are used to install the atomic beam collimation optical path; one end of the hollow pipe 4 is installed at the output. The function of the special-shaped cavity 1 is to integrate the internal heating atomic oven 7 and the vacuum device 11, and at the same time, it can meet the requirements of strontium atomic fluorescence spectrum detection and atomic beam laser collimation. At last, the strontium atomic vapor is conducted from the shaped cavity 1 to the Zeeman slower 3.

The center of the MOT cavity 2 is the location of the cold atomic cluster; 14 interfaces are designed on the horizontal plane where the atomic cluster is located, among which 13 are CF16 flange interfaces, 1 is a smooth hole with a diameter of 14 mm, and the smooth hole is used to weld the hollow pipe 4 of the Zeeman slower 3; two symmetrical observation windows 12 are designed on the vertical plane of the atomic cluster, one at the top and one at the bottom.

The linear distance between the end faces of the multiple CF16 flange interfaces and the center of the MOT cavity 2 is 75 mm. 11 optomechanical components are installed on multiple CF16 flange interfaces, which are finally used to realize the functions of laser deceleration, laser capture, optical lattice loading, clock transition detection, fluorescence detection, and re-pumping. In order to maintain the mechanical properties of the entire system, a vacuum device installation cavity 15 is provided on the outer side wall of the MOT cavity 2, and the axis of the vacuum device installation cavity 15 is perpendicular to the axis of the hollow pipe 4. The vacuum device 11 is communicated with the CF16 flange interface on the MOT cavity 2 through the CF35 flange interface and the vacuum device installation cavity 15 in sequence.

The total volume of the strontium atomic optical clock physical system provided in this embodiment is about 60 cm*42 cm*28 cm.

To sum up, compared with the conventional strontium atomic optical clock physical system, the invention has the advantages of small size, light weight, low energy consumption, simple and compact structure. Due to the adoption of a smaller cavity, the volume and weight of the magnetic field coil are greatly reduced. Very little heat is generated when it is energized and working, and the maximum surface temperature is only 40° C. In the invention, owing to the use of the MOT tube with an inner diameter of 11 mm and the observation window with a diameter of 16 mm, a smaller laser spot can be applied, and a miniaturized optical path design can also be adopted. From the miniaturization of hollow pipes, observation windows, laser spots, and optical components, the purpose of system miniaturization, light weight and low power consumption can be achieved. Since the internal heating atomic oven is arranged in the special-shaped cavity, the thermoelectric efficiency is greatly improved compared with that of the external heating oven. So far, the power consumption of the inner heating oven is only 14 W. The highly integrated optical path design not only improves the stability of the system, but also makes it very simple and quick to disassemble and install the optical path part of the physical system, which greatly simplifies the maintenance time and difficulty of the optical path part.

The above embodiments are only preferred specific implementations of the invention, and the protection scope of the invention is not limited thereto. Any simple modifications or equivalent replacements of the technical solutions that can be obviously obtained by any person skilled in the art within the technical scope disclosed by the invention fall within the protection scope of the invention.

What is claimed is:

1. A physical system of strontium optical clock applied for space station, comprises:
   a special-shaped cavity (1), in which an internal heating atomic oven (7) for heating a strontium sample to generate strontium atomic gas is arranged;
   a magneto optical trap cavity (2), which is provided with an anti-Helmholtz coil (9) for capturing strontium atoms and a remanence compensation coil (10) for eliminating stray magnetic fields on its outer wall;
   a Zeeman slower (3), which is arranged between the special-shaped cavity (1) and the magneto optical trap cavity (2); the Zeeman slower (3) comprises a hollow pipe (4) whose ends are in sealed communication with the special-shaped cavity (1) and the magneto optical trap cavity (2) respectively, and a plurality of sets of slower coils (5) are wound on the outer wall of the hollow pipe (4);
   the internal heating atomic oven (7) comprises a ceramic strontium atomic cavity (701) arranged in the special-shaped cavity (1); a thermocouple fixing sleeve (702) for fixing the strontium sample is arranged in the ceramic strontium atomic cavity (701), a heating wire (703) is arranged on the outer wall of the ceramic strontium atomic cavity (701), and the top of the ceramic strontium atomic cavity (701) is provided with a collimator (8) for sending the strontium atomic gas into the magneto optical trap cavity (2) through the hollow pipe (4) in a straight line transmission manner;
   the special-shaped cavity (1) and the magneto optical trap cavity (2) are provided with a plurality of interfaces that communicate with their respective interiors, and both are connected with a vacuum device (11) for forming a vacuum through one of the interfaces; observation windows (12) are in sealed communication with the remaining interfaces, and optomechanical components (13) for atomic capture and optical signal detection are installed in alignment with the observation windows (12).

2. The physical system of strontium optical clock applied for space station according to claim 1, wherein the length of the hollow pipe (4) is 18 cm, the outer diameter is 14 mm, and the inner diameter is 6 mm; 5 coil baffles (14) with circular arc structure are sleeved on the outer wall of the hollow pipe (4), and every set of slower coil (5) is arranged between two adjacent coil baffles (14).

3. The physical system of strontium optical clock applied for space station according to claim 2, wherein the multiple sets of the slower coils (5) from near to far from the magneto optical trap cavity (2) are respectively a first slower coil (601), a second slower coil (602), a third slower coil (603), and a fourth slower coil (604); the first slower coil (601) and the fourth slower coil (604) are 15-turn 23-layer winding structure, and the second slower coil (602) and the third slower coil (603) are 15-turn 10-layer winding structure; the slower coils (5) are made of copper enameled wire with a diameter of 1.5 mm.

4. The physical system of strontium optical clock applied for space station according to claim 1, wherein the outer part of the ceramic strontium atomic cavity (701) is sheathed with a plurality of heat shielding cylinders (704) whose diameters increase in sequence, and a top plate (705) is provided at the ends of the plurality of the heat shielding cylinders (704); the collimator (8) includes a fixing seat (801) penetrating the top plate (705), and a collimator core (802) is provided in the middle of the fixing seat (801); the end face of the collimator core (802) is provided with a plurality of evenly spaced ventilation holes, and the length orientation of each ventilation hole is in the horizontal direction; a PT100 thermocouple resistor for measuring the temperature in the oven is installed at the bottom of the ceramic strontium atomic cavity (701).

5. The physical system of strontium optical clock applied for space station according to claim 1, wherein the connecting end of the special-shaped cavity (1) and the hollow pipe (4) is provided with a plurality of observation windows (12), and the observation windows (12) are respectively located on the upper surface, the lower surface, the front surface and the back surface of the special-shaped cavity (1).

6. The physical system of strontium optical clock applied for space station according to claim 5, wherein the magneto optical trap cavity (2) is a hollow columnar structure, the magneto optical trap cavity (2) is provided with 12 interfaces communicating with its interior in a circumferential direction, and two interfaces communicating with its interior are respectively provided on the upper surface and the lower surface; one of the interfaces in the upward direction is hermetically connected with the hollow pipe (4), one interface is arranged with a vacuum device installation cavity (15), and the other interfaces are all sealed with observation windows (12).

7. The physical system of strontium optical clock applied for space station according to claim 1, wherein the anti-Helmholtz coil (9) is a pair of ring coils respectively arranged on the upper and lower parts of the magneto optical trap cavity (2); the diameter of the two anti-Helmholtz coils (9) is 33 mm, the distance between the two anti-Helmholtz coil (9) centers is 33 mm, and the two anti-Helmholtz coils (9) are both 16-turn 20-layer winding structures; the remanence compensation coil (10) is six rectangular coils, each rectangular coil is a 5-turn 5-layer winding structure; the 6 rectangular coils form a cubic hollow coil set surrounding the upper and lower parts of the magneto optical trap cavity (2), and the anti-Helmholtz coil (9) is located inside the cubic hollow coil set; the anti-Helmholtz coil (9) and the remanence compensation coil (10) are both wound by copper enameled wires with a diameter of 1 mm.

8. The physical system of strontium optical clock applied for space station according to claim 6, wherein the vacuum device (11) includes a connecting flange (1101), and the special-shaped cavity (1) and the magneto optical trap cavity (2) communicate with the vacuum device (11) through the connecting flange (1101); a ceramic rod (1102) is fixedly arranged in the connecting flange (1101), and a plurality of getter rings (1103) are sleeved on the ceramic rod (1102) along the circumferential direction and are evenly spaced; an annular titanium sheet (1104) is arranged between two adjacent pieces of the getter rings (1103), a mounting cylinder is arranged outside the plurality of getter rings (1103), and a plurality of notches are hollowed out on the outer wall of the mounting cylinder; one end of the connecting flange (1101) is provided with a gas collection chamber (1105) communicating with it, and a sealing joint (1106) is provided on the gas collection chamber (1105); a heating electrode (1107) is penetrating sealed on the outer wall of the connecting flange (1101).

9. The physical system of strontium optical clock applied for space station according to claim 8, wherein the free end of the connecting flange (1101) is in sealed connection to the interface on the special-shaped cavity (1) through a titanium pump nozzle, and the vacuum device (11) is hermetically connected to the interface on the magneto optical trap cavity (2) through the vacuum device installation cavity (15).

10. The physical system of strontium optical clock applied for space station according to claim 6, wherein the optomechanical component (13) comprises a mirror sleeve (1301) mounted on the observation window (12), the mirror sleeve (1301) is provided with a mirror (1302) with an included angle of 45° with the horizontal plane, and the top of the mirror (1302) is provided with a laser beam expander (1303) for inputting laser.

* * * * *